（12）United States Patent
Loving

(10) Patent No.: US 6,531,964 B1
(45) Date of Patent: *Mar. 11, 2003

(54) PASSIVE REMOTE CONTROL SYSTEM

(75) Inventor: Sean Thomas Loving, Mountain View, CA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/257,315

(22) Filed: Feb. 25, 1999

(51) Int. Cl.[7] .............................................. G08C 19/00
(52) U.S. Cl. ............................... 340/825.72; 340/10.1; 340/5.64; 340/825.69; 340/572.1; 340/825.56; 341/176; 341/22; 342/42; 342/51
(58) Field of Search ....................... 340/825.72, 825.54, 340/825.56, 825.69, 825.24, 825.25; 341/176; 342/42, 51; 348/734; 359/142; 379/102, 101

(56) References Cited

U.S. PATENT DOCUMENTS

| 4,519,002 A | | 5/1985 | Amano |
| 4,876,535 A | * | 10/1989 | Ballmer et al. ............... 340/5.8 |
| 5,099,227 A | * | 3/1992 | Geiszler et al. ........... 340/572.5 |
| 5,175,418 A | | 12/1992 | Tanaka |
| 5,528,222 A | | 6/1996 | Moskowitz et al. |
| 5,532,684 A | * | 7/1996 | Katsu .................... 340/825.25 |
| 5,566,441 A | | 10/1996 | Marsh et al. |
| 5,600,683 A | * | 2/1997 | Bierach et al. .............. 375/363 |
| 5,625,608 A | * | 4/1997 | Grewe et al. ................. 369/24 |
| 5,682,143 A | | 10/1997 | Brady et al. |
| 5,786,626 A | | 7/1998 | Brady et al. |
| 5,838,074 A | * | 11/1998 | Loeffler et al. ............. 340/5.61 |
| 5,847,447 A | | 12/1998 | Rozin et al. |
| 5,850,187 A | | 12/1998 | Carrender et al. |
| 5,854,480 A | | 12/1998 | Noto |
| 6,001,211 A | | 12/1999 | Hiroyuki |

* cited by examiner

Primary Examiner—Brian Zimmerman
Assistant Examiner—Yves Dalencourt
(74) Attorney, Agent, or Firm—Terri S. Hughes

(57) ABSTRACT

A passive remote control device (20, 50) is powered remotely by a radio frequency exciter/receiver (14, 42) and used in a remote control system (100, 200) to control operation of a controlled device (10, 40), such as, for example, a television, video game controller, VCR, or CD player. The remote control device and the exciter/receiver communicate without wires via electrostatic or electromagnetic radiation. No line of sight connection to the passive remote control unit is required. No power source is integrated with the remote control device. The remote control device has a plurality of keys (22, 24, 25, 26, 27, 28, 29, 30, 31, 32) or control members that are manually actuated. Depression of a key or button, or other actuation of a control member, causes a response signal associated with that key to be generated. The response signal relates to an operation for the controlled device.

20 Claims, 3 Drawing Sheets

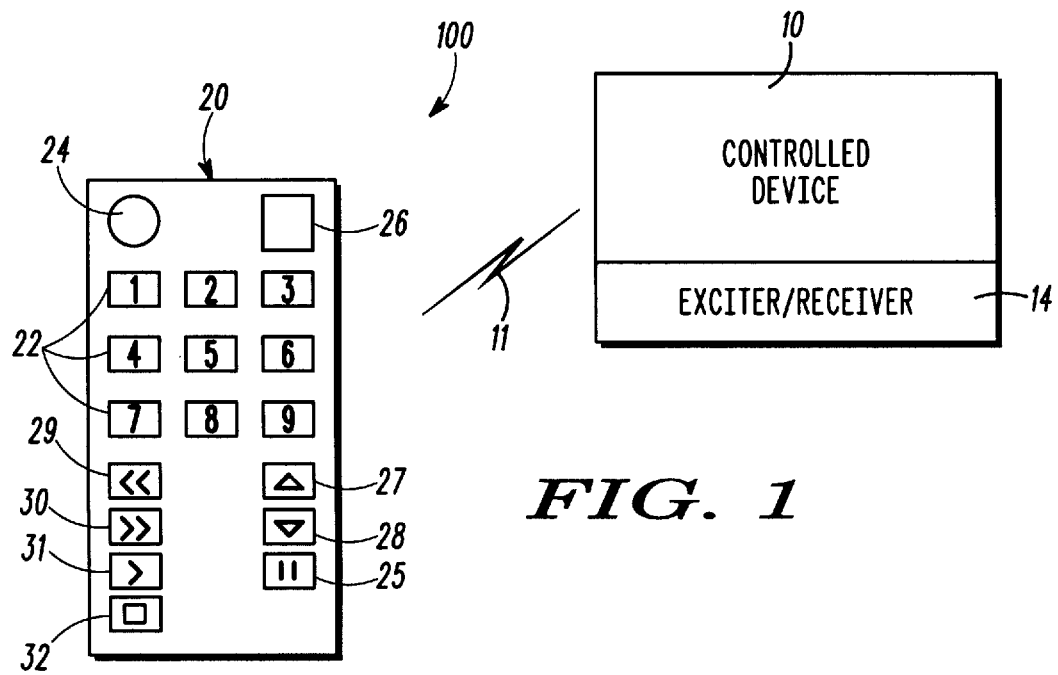
FIG. 1
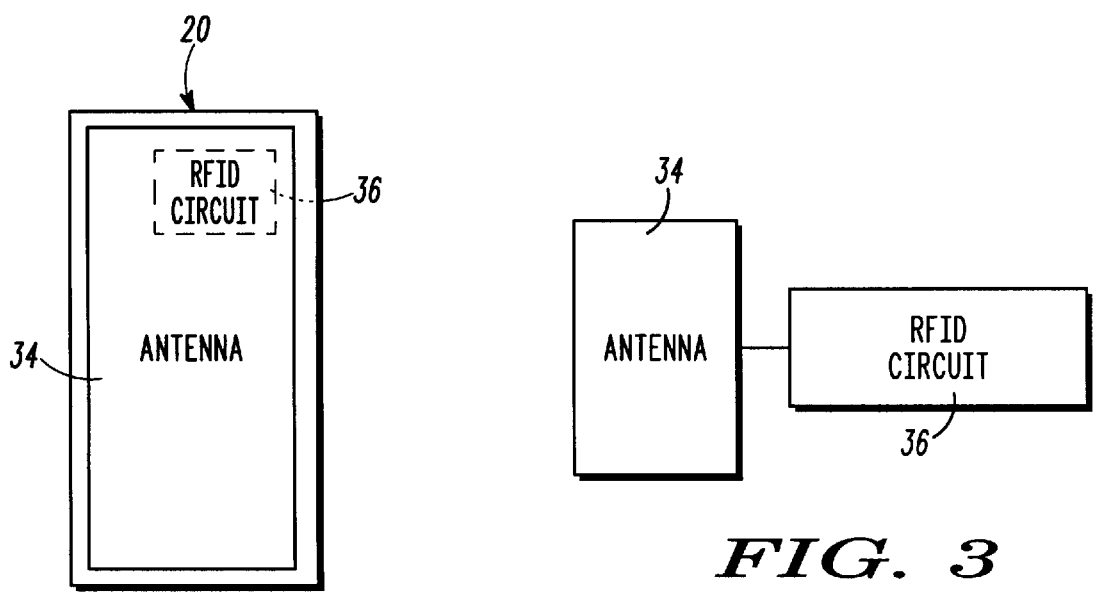
FIG. 2
FIG. 3

PASSIVE REMOTE CONTROL SYSTEM

CROSS REFERENCE TO RELATED APPLICATIONS

The present invention is related to, and incorporates by reference, a commonly assigned prior application by Theodore D. Geiszler et al., titled "Remotely Powered Electronic Tag with Plural Electrostatic Antennas and Associated Exciter/Reader and Related Method; Radio Frequency Identification Tag System Using Tags Arranged for Coupling to Ground; Radio Frequency Identification Tag Arranged for Magnetically Storing Tag State Information; and Radio Frequency Identification Tag with a Programmable Circuit State," application Ser. No. 09/061,146, filed Apr. 16, 1998, now pending.

The present invention is also related to, and incorporates by reference, a commonly assigned application by Thomas Sidlauskas et al., titled "Wireless Add-On Keyboard System and Method," application Ser. No. 09/257,663, filed on an even date herewith, now patented as U.S. Pat. No. 6,133,833.

FIELD OF THE INVENTION

The present invention relates generally to passive remote control devices, portable remotely powered communication devices, and communication devices that employ electrostatic or electromagnetic coupling. More particularly, the invention relates to radio frequency identification (RFID) units in combination with a remote control system.

BACKGROUND OF THE INVENTION

Remotely powered electronic devices and related systems for supplying power to and receiving stored information from such devices are known. For example, U.S. Pat. No. 5,009,227 issued to Geiszler et al., titled refer Proximity "Detecting Apparatus", discloses a remotely powered device that uses electromagnetic coupling to derive power from a remote source and then uses both electromagnetic and electrostatic coupling to transmit stored data to a receiver often collocated with the remote source. These systems are also known as radio frequency identification ("RFID") systems. Such RFID systems are usable in numerous applications, including, for example, in inventory control, livestock control, and sentry systems. Additionally, radio frequency identification tags are used in electronic article surveillance ("EAS") systems, such as those used at exits in retail establishments where merchandise is sold.

Typically, RFID systems are limited to applications for identification and tracking of persons or things. This limitation is due in part to the power, space and cost associated with adding a complex control application to an RFID tag. Generally, RFID tags and systems are optimized to reduce the size, power and cost requirements for the RFID tag. Unfortunately, this optimization tends to limit the ability to apply traditional techniques (e.g., adding circuitry) to expand functions on an RFID tag. Therefore, novel techniques are required to efficiently add control functions to an RFID tag without adversely affecting the size cost and power requirements.

Remote control devices are also known. Remote control devices are used for more complex control operations, for example, to remotely control all types of electronic devices and appliances, including televisions, videocassette recorders, cameras and a plethora of other devices. Remote control devices commonly use infrared or radio frequency wireless data transmission. Typically these remote control devices have an integrated power source such as batteries. The integrated power source removes some of the limitations associated with adding control in a remotely powered RFID system.

One problem with traditional remote control devices is the requirement of an integrated or wired power source such as a battery. As is universally known, batteries do not last forever and their certain but untimely demise is a continuing source of inconvenience and frustration. Another problem, at least with infrared remote control devices, is the requirement that there be a line of sight between the remote control device and the device being controlled, i.e., the controlled device. Not only is this a problem from the perspective of using the remote control device, but this also limits the location of the infrared receiver in the controlled device.

Therefore, a need exists for a remote control device that is capable of complex control operations, but does not require a direct power source such as a battery and requires no line of sight for operation.

BRIEF DESCRIPTION OF THE DRAWINGS

FIG. 1 is a schematic diagram of a remote control system in accordances with a preferred embodiment of the present invention.

FIG. 2 is a schematic diagram of a rear side of the passive remote control device of FIG. 1.

FIG. 3 is a schematic illustration of the radio frequency identification circuit and antenna of the passive remote control device of FIG. 1.

DETAILED DESCRIPTION OF THE PREFERRED EMBODIMENTS

Figure 4:
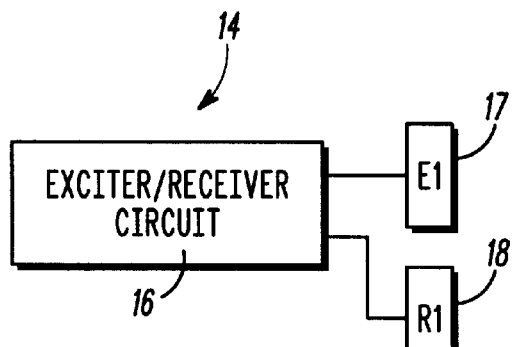
FIG. 4 is a schematic illustration of an exciter/receiver device that is associated with a controlled device as shown in FIG. 1.

Briefly, a remote control system according to the invention includes a remote control device, an exciter/receiver and a controlled device. The exciter/receiver is associated with and coupled to the controlled device to control operations of the controlled device. The exciter/receiver produces an excitation field via electrostatic radiation or electromagnetic radiation or both of these. The excitation field powers the remote control device. The remote control device includes a manually actuated element that when actuated causes the remote control device to produce a response signal. The response signal is detected by the exciter/receiver and decoded to determine an operation for the controlled device. The controlled device is, for example, a television, videocassette recorder, video game, compact disc player, radio receiver or other device or appliance. The manually actuated element is, for example, a key, button, or joystick.

FIG. 1 schematically shows a remote control system 100 in accordance with the present invention. The system 100 includes a remote control device 20 and a controlled device 10. The remote control device 20 is in signal communication with controlled device 10 over the air, as represented by signal 11. Remote control device 20 controls the operations or functions of controlled device 10.

Controlled device 10 is any type of appliance or other device that is amenable to have its operation controlled by a user located at some distance away from the device. Exemplary controlled devices include televisions, radio receivers, record players, videocassette recorders, cameras, compact disc players, computer cursor controllers, printers, facsimile machines and video game systems.

In accordance with the invention, controlled device 10 includes an exciter/receiver 14, also commonly referred to as a radio frequency identification reader or simply a reader. Exciter/receiver 14 generates an excitation field via electrostatic radiation, electromagnetic radiation or both of these. Exciter/receiver 14 also detects or receives electrostatic or electromagnetic radiation or both. Exciter/receiver 14 is preferably integrated into the housing of controlled device 10. Alternatively, exciter/receiver 14 is a separate component mounted on a surface on the housing of controlled device 10 or placed adjacent to controlled device 10. Exciter/receiver 14 is operably coupled to or within controlled device 10 via any suitable connection technology, including wires, a printed circuit or a wireless communication protocol and system. In general, in remote control systems currently using remote control devices, exciter/receiver 14 replaces the function provided by the infrared or radio frequency receiver associated with the controlled device. In contrast to at least infrared receivers, exciter/receiver 14 is advantageously placed or mounted with respect to controlled device 10 in numerous configurations since no line of sight is required for communication with a remote control device.

Remote control device 20 is typical in physical configuration to prior remote control devices. However, unlike prior remote control devices, remote control device 20 does not require an integrated power source such as a battery. Also, remote control device 20 does not require wires to be connected with an external power source such as an AC or DC adapter. Instead, in accordance with the present invention, the electrostatic or electromagnetic excitation field generated by exciter/receiver 14 passively powers remote control device 20. That is, remote control device 20 derives its power for operation from the electromagnetic or electrostatic radiation produced by exciter/receiver 14.

Remote control device 20 includes a plurality of keys or buttons that are manually actuated to accomplish an operational feature associated with a controlled device 10. In the preferred embodiment shown in FIG. 1, remote control device 20 includes a plurality of numeric keys 22, a power ON/OFF button 24, a device selector 26, a channel advance forward button 27, a channel advance backward button 28, a pause button 25, a fast forward button 29, a reverse button 30, a play button 31, and a stop button 32. Device selector 26 is used to select among a plurality of controlled devices. This permits use of remote control device 20 with a plurality of controlled devices. The other functions associated with the keys or buttons of remote control device 20 are well known and further description is omitted.

Remote control device 20 generates an electrostatic or electromagnetic response signal in response to the excitation signal from exciter/receiver 14. In accordance with the present invention, the nature of the response signal is determined in part by the key or button pressed or actuated on remote control device 20.

FIG. 2 is a rear view of remote control device 20. Remote control device 20 has an antenna 34 mounted to its rear side. Mounted within remote control device 20 is a radio frequency identification circuit 36 shown in phantom in FIG. 2. Radio frequency identification circuit 36 is operably coupled to antenna 34, as is shown schematically in FIG. 3. Radio frequency identification circuit 36 is also coupled to the plurality of keys of remote control device 20, as discussed below.

In the case where remote control device 20 detects an electrostatic excitation signal and generates an electrostatic response signal, antenna 34 is preferably a metal electrode antenna, a metallized label, or other structure usable as an electrostatic capacitive antenna. In the case where remote control device 20 detects an electromagnetic excitation signal and generates an electromagnetic response signal, antenna 34 is preferably a coil of wire or metal-on-film printed coil, or other coil structure usable as an electromagnetic antenna. The location of antenna 34 varies including on the exterior of remote control device 20 or within the interior of remote control device 20. Also, the shape size, configuration and number of antenna elements of antenna 34 varies depending on the application.

Radio frequency identification circuit 36 comprises the electronics necessary to convert the electromagnetic or electrostatic radiation into a power source, decode the excitation signal if necessary and respond to the excitation signal with an appropriate response signal. In accordance with the present invention, the response signal is determined in part by the key or button depressed on remote control device 20. Exciter/receiver 14 detects or receives the response signal and in accordance with a predetermined scheme, determines which key, if any, is actuated. Then, based on the key actuated, exciter/receiver 14 communicates a corresponding operation to the controlled device. The interface between radio frequency identification circuit 36 and the plurality of remote control keys is discussed further below with respect to FIGS. 7 and 8.

FIG. 4 is a schematic illustration of exciter/receiver 14 of FIG. 1. The exciter/receiver 14 shown in FIG. 4 has an exciter/receiver circuit 16 and electrostatic antenna elements 17, 18 for communicating with the remote control device 20. The electrostatic antenna elements include an electrostatic exciter antenna element 17, labeled E1, and an electrostatic receiver antenna element 18, labeled R1. The exciter/receiver circuit 16 includes circuitry to produce an excitation signal that is radiated by electrostatic exciter antenna element 17. The exciter/receiver circuit 16 also includes circuitry to receive and decode a response signal produced by remote control device 20 and detected by electrostatic receiver antenna element 18. While only a single electrostatic receiver antenna element R1 is shown, and only a single electrostatic exciter antenna element E1 is shown, these are merely representative of antenna systems generally used in such devices, and alternatively multiple antennas, and electromagnetic antenna coils are employed. Also, the exciter function may be separate from the receiver function.

In operation, an excitation signal is produced by controlled device 10 at a predetermined frequency. Typically this frequency is 125 KHz. The remote control device 20 detects the excitation signal and causes radio frequency identification circuit 36 to power up. When one of the keys on remote control device 20 is depressed, a response signal is generated by radio frequency identification circuit 36 and radiated by antenna 34. In this manner, remote control device 20 serves as an electrostatic or electromagnetic wireless input device when a key on the remote control device 20 is depressed. The response signal from the remote control device 20 is preferably a modulation of the excitation signal, for example, at a frequency of 62.5 KHz. Most preferably, the response signal is a pulse code modulation of the excitation signal at 62.5 KHz. According to the invention, a predetermined code is transmitted for each key or button depressed. Thus, upon receiving and decoding the response signal, the exciter/receiver 14 determines the operation associated with the controlled device that should be performed.

Figure 5:
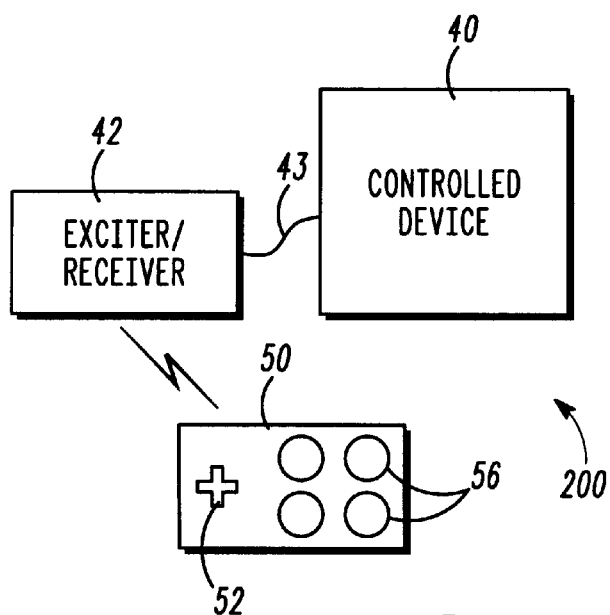
FIG. 5 is a schematic diagram of a passive remote control device in a video game system in accordance with the present invention.

FIG. 5 is a schematic diagram of another preferred embodiment of the present invention employing a passive remote control device 50 in a video game system 200. Video game system 200 includes an exciter/receiver 42, a controlled device 40 and remote control device 50. Remote control device 50 constitutes a game controller pad. Exciter/receiver 42 indirectly powers remote control device 50 and communicates commands from remote control device 50 to the controlled device 40. The controlled device 40 is alternatively a video game station or a video game station in combination with a television. Exciter/receiver 42 is coupled to the control device via wires 43.

Remote control device 50 includes a plurality of buttons or keys 56 and a directional control keypad 52. Directional control keypad 52 operates a plurality of key elements, one for each direction, or has any type of known arrangement in the game controller arts. Alternatively, a joystick (not shown) replaces keypad 52. The joystick serves as a direction controller in video game and computer systems.

Figure 6:
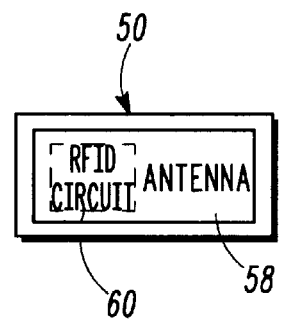
FIG. 6 is a schematic diagram of a rear side of the passive remote control device of FIG. 5.

FIG. 6 is a schematic diagram of a rear side of the remote control device 50 of FIG. 5. The remote control device has an electrostatic antenna element 58 and associated radio frequency identification circuit 60. Exciter/receiver 42 operates in a manner similar to exciter/receiver 14. Similarly, remote control device 50 operates in a manner similar to remote control device 20. Via electrostatic or electromagnetic radiation or both of these, remote control device 50 is remotely powered such that actuation of buttons or keys 56 and directional control keypad 52 causes a response signal to be generated that is received and decoded by exciter/receiver 42 and translated into an operation for controlled device 40. The operation performed in controlled device 40 is determined by the operation performed on remote control device 50.

Figure 7:
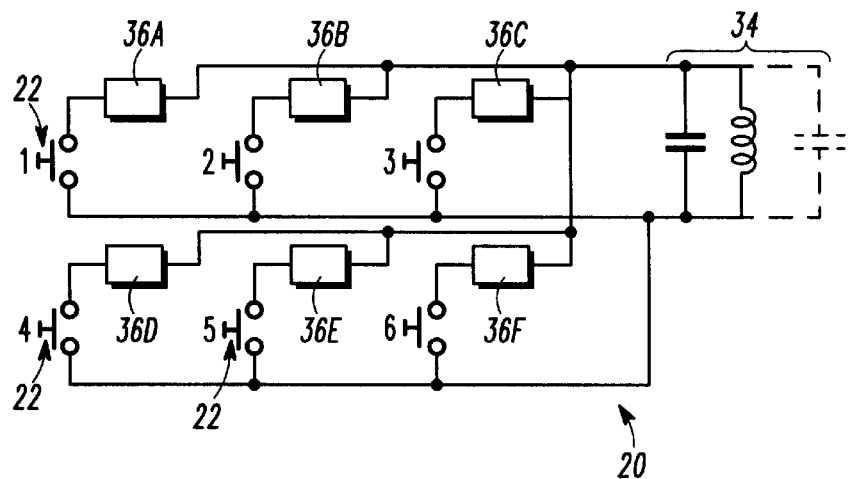
FIG. 7 is a partial schematic diagram of a preferred embodiment of the passive remote control device of FIG. 1.

FIG. 7 is a partial schematic diagram of remote control device 20 showing the coupling between the buttons or keys 22 of remote control device 20 with radio frequency identification circuits 36A–F and antenna 34. In this preferred arrangement, a plurality of radio frequency identification circuits are provided, a circuit for each key or button. All the keys of remote control device 20 are not shown in FIG. 7, but all the keys are coupled in a manner analogous to the keys shown. Antenna 34 is shown as both an electromagnetic and electrostatic antenna with the electrostatic antenna shown in phantom.

Each radio frequency identification circuit 36A–F has one direct or wired connection to antenna 34. The other connection to antenna 34 is via the key associated with the radio frequency identification circuit. More specifically, the key must be depressed to connect the radio frequency identification circuit to antenna 34 in a manner to allow the radio frequency identification circuit to power up and respond to an excitation signal. In other words, an open circuit between the radio frequency identification circuit and antenna is provided and closed only when the key is depressed.

Radio frequency identification circuits 36A–F each contain a code storing circuit that determines the response code sent by the remote control device. The code storing circuit is preferably a ROM or RAM, but any suitable memory device is alternatively used.

Figure 8:
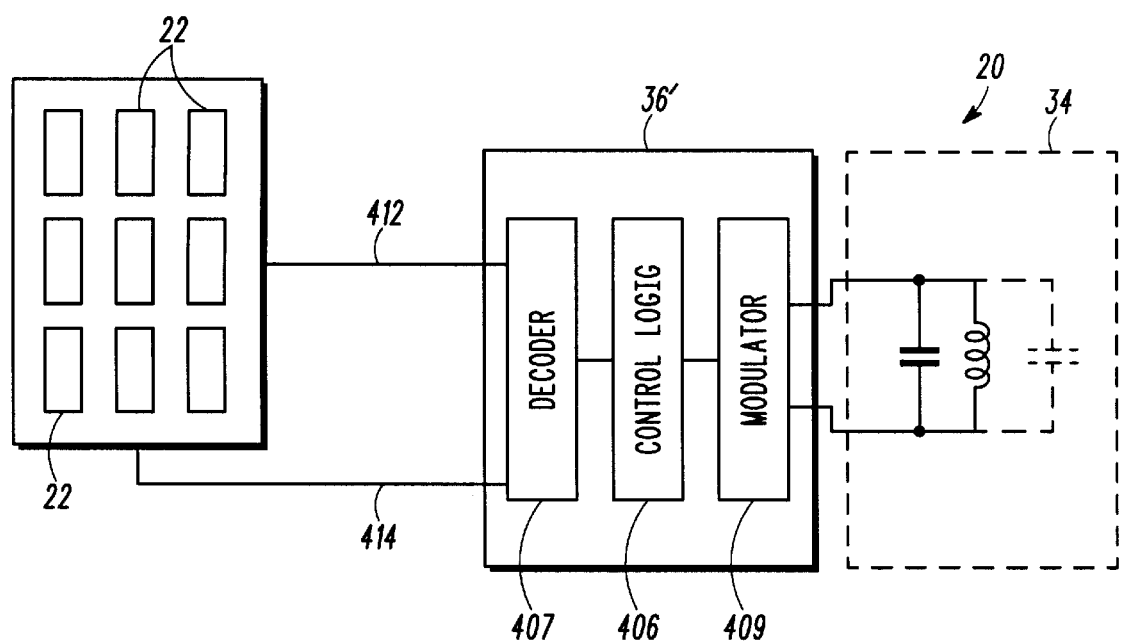
FIG. 8 is a schematic diagram of an alternate preferred embodiment of the passive remote control device of FIG. 1.

FIG. 8 shows an alternate preferred embodiment of remote control device 20 wherein rather than having a radio frequency identification circuit per key, a single radio frequency circuit 36' is provided. The keys or buttons have a plurality of wires 412, 414 that interface to radio frequency identification circuit 36'. Radio frequency identification circuit 36' is directly connected or wired to antenna 34, shown as an electrostatic and electromagnetic antenna with the electrostatic portion shown in phantom.

Radio frequency identification circuit 36' includes a keypad decoder 407, control logic 406 and a modulator 409. Keypad decoder 407 interfaces with the plurality of wires or lines from the keys. Preferably the keys have a row and column selection and the lines 412 represent the column while the lines 414 represent the row. The row and column are decoded within decoder 407 to determine which key is depressed. There are alternate arrangements for determining which key is depressed and interfacing the keys to the circuit, including having a line associated with each key.

After the decoder determines which key is depressed, the control logic determines a modulation to apply. Preferably the control logic includes a code storing circuit that stores a predetermined code for each key. The code determines the modulation to apply. The code storing circuit is preferably a ROM or RAM, but any suitable memory is alternatively used. Modulator 409 applies the modulation determined by the control logic to antenna 34 so that a predetermined response signal is radiated by antenna 34. The exciter/receiver detects this response signal as described previously herein.

A remote control system in accordance with the present invention advantageously provides a passive or batteryless remote control device. This alleviates the frustration, inconvenience and unreliability of batteries. In addition, flexibility is added in operating the remote control system because the remote control device works without a direct line of sight. Removing the restriction of a direct line of sight also allows flexibility in the design and placement of the exciter/receiver and the associated controlled device.

The invention being thus described, it will be evident that the same may be varied in many ways. Such variations are not to be regarded as a departure from the spirit and scope of the invention and all such modifications are intended to be included within the scope of the claims.

I claim:
1. A remote control system, comprising:
   an exciter associated with a controlled device, the exciter producing an electrostatic excitation field and employing electrostatic radio frequency communication; and
   a remote control device, capacitively coupled to the exciter, and powered by the electrostatic excitation field, for remotely communicating with the exciter via a capacitive interface for controlling operations of the controlled device.
2. The remote control system of claim 1, wherein the remote control device has at least one manually actuated element used for controlling operations of the controlled device.
3. The remote control system of claim 1, wherein the controlled device is selected from a group consisting of: a television, a radio receiver, a videocassette recorder, a compact disc player, a record player, a video game system, a computer cursor controller, a printer, and a facsimile machine.

4. The remote control system of claim 1, wherein the excitation field is produced by an excitation signal.

5. The remote control system of claim 4, wherein the excitation signal has a frequency of 125 KHz.

6. The remote control system of claim 5, wherein the remote control device produces a response field when a selected one of a plurality of keys is actuated.

7. The remote control system of claim 6, wherein the response field is produced by a response signal.

8. The remote control system of claim 7, wherein the response signal has a frequency of 62.5 KHz.

9. The remote control system of claim 1, wherein the remote control device has at least one manually actuated element and produces a response field when said at least one manually actuated element is actuated.

10. The remote control system of claim 1, wherein the remote control device has a circuit and at least one manually actuated element, wherein the at least one manually actuated element selectively places the circuit in one of a closed circuit configuration and an open circuit configuration.

11. The remote control system of claim 1, wherein the remote control device comprises:
   a circuit having a closed circuit configuration and an open circuit configuration;
   an electrostatic antenna; and
   at least one actuated element that is capable of placing the circuit in the closed circuit configuration and coupling the electrostatic antenna to produce a pulse code signal.

12. The remote control system of claim 1, wherein the remote control device comprises:
   a first circuit having a closed circuit configuration and an open circuit configuration;
   an electrostatic antenna;
   a code storing circuit that stores a code; and
   at least one actuated element operable to place the first circuit in the closed circuit configuration and to couple the electrostatic antenna to produce a pulse code signal corresponding o he code stored in the code storing circuit.

13. The remote control system of claim 1, wherein the remote control device includes at least one of the following: a directional keypad, a power on/off key, a channel selector, a channel advance key, a joystick, and a non-alphanumeric input key.

14. A remote control system powered by an excitation field, the remote control system comprising:
   a controlled device;
   an exciter coupled to the controlled device, the exciter producing an electrostatic excitation field generated by electrostatic radiation;
   a remote control device, powered capacitively by the electrostatic excitation field, in signal communication with the exciter such that the remote control device produces an electrostatic response signal; and
   at least one manually actuated element on the remote control device, the manually actuated element being coupled to a radio frequency identification circuit such that actuation of the manually actuated element causes the remote control device to produce a predetermined response signal for controlling an operation of the controlled device.

15. The remote control system of claim 14 wherein the manually actuated element is selected from a group consisting of: a numeric button, a joystick, a directional keypad, a power on/off button, and device selector.

16. The remote control system of claim 15 wherein the controlled device is selected from a group consisting of: a television, a radio receiver, a videocassette recorder, a compact disc player, a record player, a video game system, a computer cursor controller, a printer, and a facsimile machine.

17. The remote control system of claim 14 wherein the at least one radio frequency identification circuit is a single radio frequency identification circuit comprising:
   a decoder coupled to the plurality of manually actuated elements to decode a depressed manually actuated element;
   control logic coupled to the decoder to determine a selected modulation based on the depressed manually actuated element; and
   a modulator coupled to the control logic to receive the selected modulation and provide a modulated signal to an antenna, the modulated signal being determined by the selected modulation.

18. A method of controlling a controlled device with a remote control device, the method comprising the steps of:
   generating an electrostatic excitation field via electrostatic radiation;
   powering the remote control device capacitively with the electrostatic excitation field;
   actuating a manually actuated element on the remote control device to produce an electrostatic response signal;
   receiving the electrostatic response signal at the controlled device; and
   determining an operation to be performed by the controlled device based on the response signal.

19. A method of controlling a controlled device with a remote control device, the method comprising the steps of:
   receiving an excitation signal via electrostatic radiation;
   powering the remote control device capacitively with the excitation signal; and
   producing an electrostatic response signal to control an operation of the controlled device.

20. The remote control system of claim 1 wherein the remote control device is not required to be within a line of sight of at least one of the controlled device and the exciter.

* * * * *